US012648099B2

(12) United States Patent
Aizawa et al.

(10) Patent No.: US 12,648,099 B2
(45) Date of Patent: Jun. 2, 2026

(54) SOCKET INCLUDING A HOUSING AND A PLURALITY OF CONTACTS

(71) Applicant: Tyco Electronics Japan G.K., Kawasaki (JP)

(72) Inventors: Masayuki Aizawa, Kawasaki (JP); Naoki Hashimoto, Kawasaki (JP)

(73) Assignee: TE CONNECTIVITY JAPAN, G.K., Kawasaki (JP)

( * ) Notice: Subject to any disclaimer, the term of this patent is extended or adjusted under 35 U.S.C. 154(b) by 697 days.

(21) Appl. No.: 17/954,814

(22) Filed: Sep. 28, 2022

(65) Prior Publication Data

US 2023/0102245 A1 Mar. 30, 2023

(30) Foreign Application Priority Data

Sep. 28, 2021 (JP) ................................. 2021-158377

(51) Int. Cl.
*H05K 7/10* (2006.01)
*H01R 12/71* (2011.01)
*H05K 5/02* (2006.01)

(52) U.S. Cl.
CPC ......... *H05K 5/0286* (2013.01); *H01R 12/716* (2013.01); *H05K 7/1069* (2013.01)

(58) Field of Classification Search
CPC ... H05K 5/0286; H05K 7/1069; H01R 12/716
USPC .......................................................... 439/66
See application file for complete search history.

(56) References Cited

U.S. PATENT DOCUMENTS

| | | | |
|---|---|---|---|
| 6,926,536 B2 * | 8/2005 | Ochiai | ................... H01R 43/16 |
| | | | 439/91 |
| 7,102,373 B2 | 9/2006 | Yoshida | |
| 8,672,688 B2 * | 3/2014 | Florence, Jr. | .......... H01R 12/52 |
| | | | 439/66 |
| 9,172,161 B2 * | 10/2015 | Walden | .............. H01R 13/2435 |
| 10,003,150 B1 * | 6/2018 | Ju | .......................... H01R 12/57 |

(Continued)

FOREIGN PATENT DOCUMENTS

| | | |
|---|---|---|
| JP | 2006098375 A | 4/2006 |
| JP | 2006344604 A | 12/2006 |

(Continued)

OTHER PUBLICATIONS

Japanese Office Action dated May 27, 2025 with English translation, corresponding to Application No. 2021-158377, 9 pages.

*Primary Examiner* — Tulsidas C Patel

(57) ABSTRACT

A socket includes a housing and a plurality of contacts. The housing has a bottom plate with a first face and a second face that are parallel to each other. Contact supporting holes penetrate the first face and the second face. The housing has a frame body disposed upright on an edge of the first face and extending along the edge. The contacts are disposed in the contact supporting holes and supported by the bottom plate in a state in which the contacts protrude from both the first face and the second face. The contacts include a first contact having a first base inserted into one of the contact supporting holes, a first contact portion having a pair of first protrusions protruding from one edge of the first base, and a second contact portion having a pair of second protrusions protruding from another edge of the first base.

19 Claims, 12 Drawing Sheets

(56) References Cited

U.S. PATENT DOCUMENTS

| | | | | |
|---|---|---|---|---|
| 10,103,463 B1 * | 10/2018 | Hughes | ................. | H01R 13/04 |
| 10,103,470 B2 * | 10/2018 | Ju | ........................ | H01R 12/714 |
| 10,116,080 B1 * | 10/2018 | Ju | ........................ | H01R 12/714 |
| 10,547,136 B2 * | 1/2020 | Ho | .................... | H01R 13/2464 |
| 10,797,424 B2 * | 10/2020 | Hsu | .................... | H01R 12/7076 |
| 10,825,791 B2 * | 11/2020 | Hashimoto | ........... | H01R 33/74 |
| 11,139,593 B2 * | 10/2021 | Ho | ........................ | H01R 43/20 |
| 11,177,603 B2 * | 11/2021 | Hashimoto | ........... | H01R 31/06 |
| 11,183,784 B2 | 11/2021 | Hashimoto et al. | | |
| 11,251,570 B2 * | 2/2022 | Chen | ................. | H01R 13/6474 |
| 11,309,646 B2 * | 4/2022 | Ou | .................... | H01R 12/7082 |
| 11,404,811 B2 * | 8/2022 | Do | .................... | H01R 12/7082 |
| 12,394,941 B2 * | 8/2025 | Hashimoto | ........... | H01R 13/24 |
| 2019/0148858 A1 * | 5/2019 | Mason | ................. | H01R 13/111 |
| | | | | 439/67 |
| 2020/0021048 A1 * | 1/2020 | Tu | ........................ | H01R 12/57 |
| 2020/0052429 A1 * | 2/2020 | Hwang | ................. | H01R 13/41 |
| 2020/0076124 A1 * | 3/2020 | Tagashira | ............. | H05K 7/1415 |
| 2020/0119472 A1 * | 4/2020 | Ishida | ................. | H01R 12/712 |
| 2020/0203866 A1 * | 6/2020 | Hashimoto | ........ | H01R 13/2435 |
| 2020/0411410 A1 * | 12/2020 | Klein | .................... | H01L 23/427 |
| 2021/0028569 A1 * | 1/2021 | Hashimoto | ........... | H01R 31/06 |
| 2021/0203110 A1 * | 7/2021 | Chen | ................. | H01R 13/2435 |
| 2021/0274673 A1 * | 9/2021 | Blackburn | ......... | H01L 23/4006 |
| 2022/0037823 A1 * | 2/2022 | Hashimoto | ........... | H01R 13/41 |
| 2023/0307860 A1 * | 9/2023 | Hashimoto | ......... | H01R 12/714 |
| 2023/0411906 A1 * | 12/2023 | Morgan | ............. | H01R 13/2435 |

FOREIGN PATENT DOCUMENTS

| | | | |
|---|---|---|---|
| JP | 2016503946 A | 2/2016 | |
| JP | 2020098747 A | 6/2020 | |
| JP | 2021018960 A | 2/2021 | |
| JP | 2021072175 A | 5/2021 | |
| WO | 2014092904 A1 | 6/2014 | |

* cited by examiner

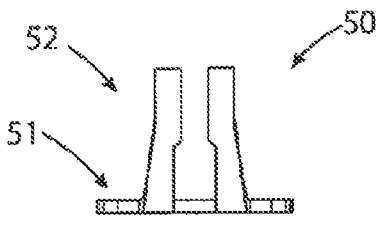
FIG. 4A
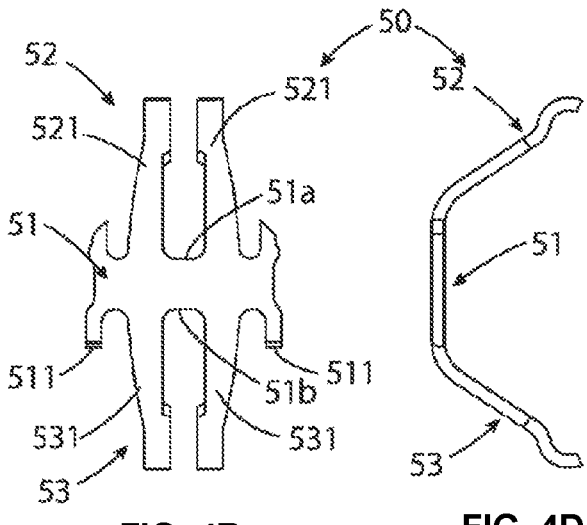
FIG. 4B
FIG. 4D
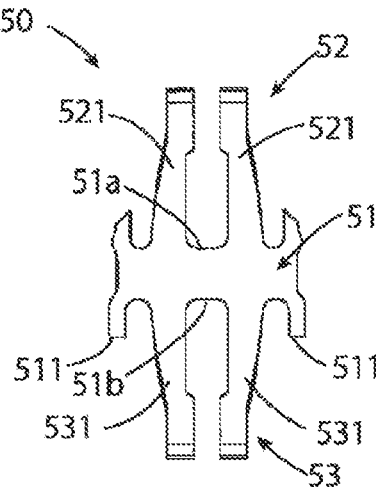
FIG. 4E
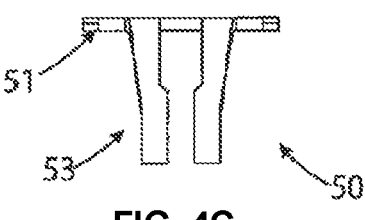
FIG. 4C

SOCKET INCLUDING A HOUSING AND A PLURALITY OF CONTACTS

CROSS-REFERENCE TO RELATED APPLICATION

This application claims the benefit of the filing date under 35 U.S.C. § 119(a)-(d) of Japanese Patent Application No. 2021-158377, filed on Sep. 28, 2021.

FIELD OF THE INVENTION

The present invention relates to a socket, to which an electronic component including a bottom face, on which contact pads are two-dimensionally arranged, is attached.

BACKGROUND

Electronic components such as CPUs (central processing units) are often mounted via interposer-type sockets, rather than directly soldered to circuit boards, when the electronic components are mounted on the circuit boards. In other words, the sockets are often placed on the circuit boards, and the electronic components are often attached to the sockets. A plurality of contacts that come into contact with respective contact pads arranged on the bottom face of such an electronic component are arranged on such a socket so that the contacts protrude from a first face of a flat-plate-shaped housing.

Japanese Patent Application No. 2021-018960A discloses an interposer for the purpose of improving electrical characteristics. The interposer disclosed in JP 2021-018960A has a shape in which contacts are inserted into a plurality of respective through-holes opened in a flat-plate-shaped housing and protrude through both the first and second faces of the flat-plate-shaped housing.

In recent years, a socket including quite a number of pins, in which the number of contacts is, for example, ten thousand or the like, to be ready for large-scale electronic components has been demanded. With regard to performance, the higher performance of the socket has been demanded. Moreover, the socket desirably has a design in which a common housing and common contacts can be used even for electronic components with different specifications, which can be mounted on the socket, without newly redesigning the housing and the contacts.

SUMMARY

A socket includes a housing and a plurality of contacts. The housing has a bottom plate with a first face and a second face that are parallel to each other. Contact supporting holes penetrate the first face and the second face. The housing has a frame body disposed upright on an edge of the first face and extending along the edge. The contacts are disposed in the contact supporting holes and supported by the bottom plate in a state in which the contacts protrude from both the first face and the second face. The contacts include a first contact having a first base inserted into one of the contact supporting holes, a first contact portion having a pair of first protrusions protruding from one edge of the first base, and a second contact portion having a pair of second protrusions protruding from another edge of the first base.

BRIEF DESCRIPTION OF THE DRAWINGS

The invention will now be described by way of example with reference to the accompanying Figures, of which:

FIG. 4A is a top view of a power contact;

FIG. 4B is a front view of the power contact;

FIG. 4C is a bottom view of the power contact;

FIG. 4D is a side view of the power contact;

FIG. 4E is a rear view of the power contact;

DETAILED DESCRIPTION OF THE EMBODIMENTS

Figure 1:
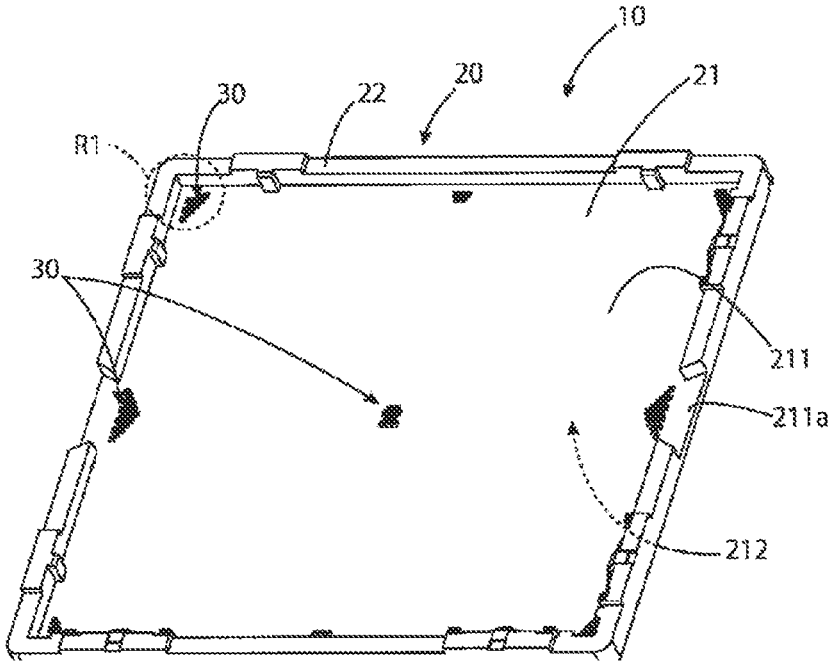
FIG. 1 is an isometric view of a socket according to an embodiment.

Embodiments of the invention will be described below. Various elements in the drawings are merely schematically and illustratively shown for understanding of the present disclosure and may differ in outward appearance and/or dimensional ratio from actual ones. Furthermore, the following description uses, on an as-needed basis, terms that indicate particular directions or positions. However, the use of these terms is intended to facilitate understanding of the invention with reference to the drawings, and the meanings of these terms are not intended to limit the technical scope of the present disclosure. Further, components given identical reference signs throughout a plurality of drawings refer to identical or equivalent components.

A socket 10 according to an embodiment is shown in FIG. 1. This socket 10 includes a housing 20 and a number of contacts 30. The housing 20 includes a bottom plate 21 and a frame portion 22. The bottom plate 21 is a flat-plate-shaped portion including a first face 211 and a second face 212 as the back face of the first face 211, which are parallel to each other, in the housing 20. A number of contact supporting holes 213 (see FIG. 2) penetrating the first face 211 and the second face 212 are arranged in the bottom plate 21.

The frame portion 22 is disposed upright on the edge 211*a* of the first face 211, and extends along the edge 211*a*. An electronic component 70 (see FIGS. 11A-E) is mounted on an area closer to the first face 211 of the bottom plate 21. The frame portion 22 serves for locating the in-plane direction of the first face 211 in the case of mounting the electronic component 70.

Figure 2:
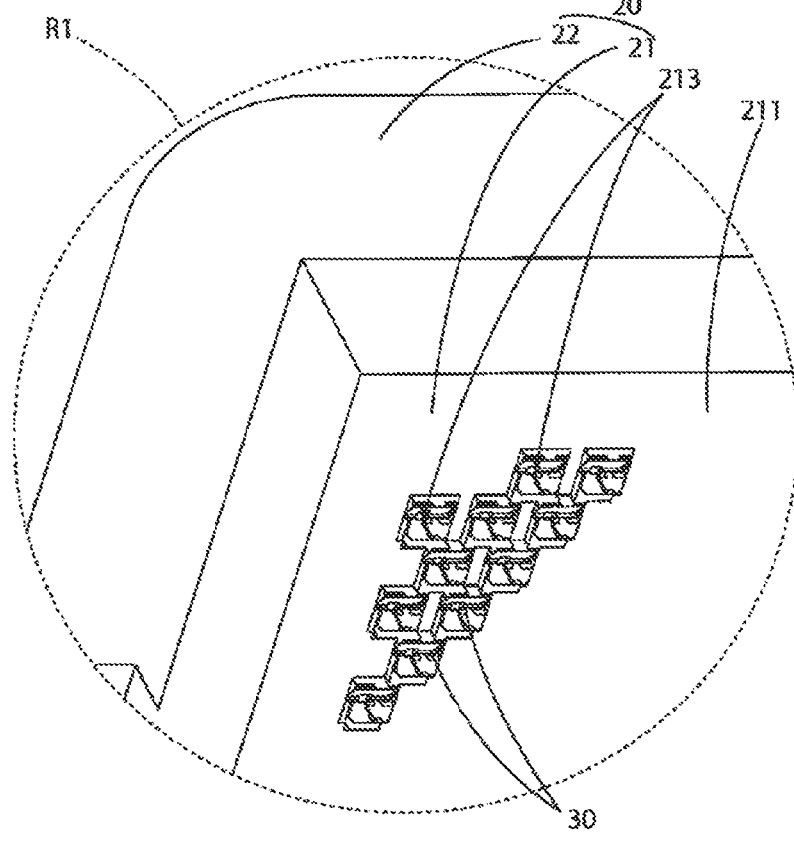
FIG. 2 is an enlarged view of a portion in circle R1 in FIG. 1.
Figures 3A, 3B, 3C, 3D, 3E:
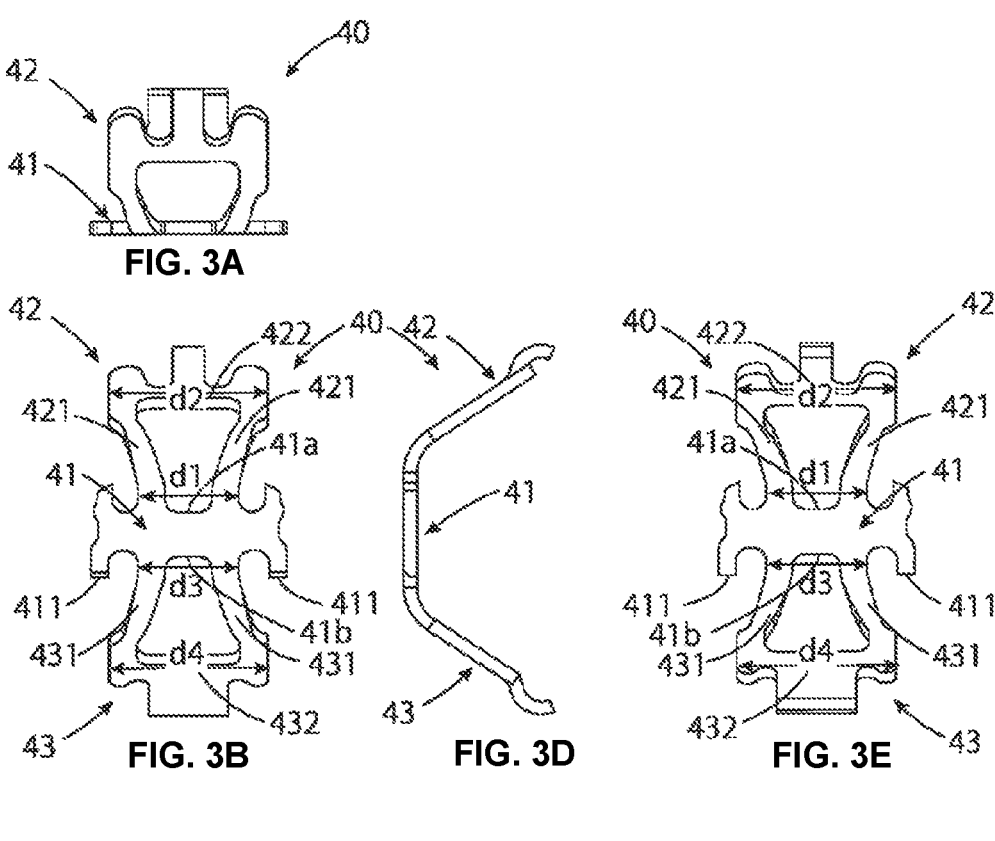
FIG. 3A is a top view of a common contact.
FIG. 3B is a front view of the common contact.
FIG. 3C is a bottom view of the common contact.
FIG. 3D is a side view of the common contact.
FIG. 3E is a rear view of the common contact.

FIG. 2 illustrates several contact supporting holes 213. However, the contact supporting holes 213 similar to such contact supporting holes 213 are formed on the substantially entire face of the bottom plate 21, except in the immediate vicinities of the frame portion 22. As illustrated in FIG. 2, the contacts 30 are inserted into the respective contact supporting holes 213 on a one-by-one basis, interlock with the inner walls of the respective contact supporting holes 213, and are supported by the bottom plate 21. The length of each of the contacts 30 in the thickness direction of the bottom plate 21 is greater than thickness of the bottom plate 21, and the contacts 30 are in the state of being inserted into the respective contact supporting holes 213 and protruding from both the first face 211 and the second face 212. In FIG. 1, all the contacts 30 cannot be illustrated for clarity, and therefore, a small minority of the contacts 30 are illustrated.

The socket 10 is placed on a circuit board 80 (see FIGS. 11A-E), and carries out electrical connection between the electronic component 70 and the circuit board 80 mounted on the socket 10.

Three kinds of contacts having shapes different from each other are adopted in the socket 10 of the present embodiment. Each of two of the kinds is a single contact, and the remaining kind includes two contacts included in a contact pair. In FIGS. 1 and 2, the contacts are typically referred to as the contacts 30. Hereinafter, the contacts that are separately denoted by reference numerals according to the kinds of the contacts are described in turn.

FIGS. 3A-E show a common contact 40. A pad for a ground, a pad for a power source, and a pad for signal transmission are arranged on the bottom face of the electronic component 70 mounted on the socket 10. The common contact 40 is a contact that connects the pad for a ground among the pads and a ground on the circuit board 80 to each other.

As shown in FIGS. 3A-E, the common contact 40 includes a first base 41, a first contact portion 42, and a second contact portion 43. The reason that the base is not referred merely as a base but is referred to as the first base 41 is because the base is distinguished from the bases of the other kinds of contacts described later. The first contact portion 42 and the second contact portion 43 are intended to distinguish between the contact portion closer to the electronic component 70 and the contact portion closer to the circuit board, and to be further distinguished from the contact portions of the other kinds of the contacts. The common contact 40 corresponds to an example of the first contact described in the present invention.

The first base 41 is inserted into each of the contact supporting holes 213 and interlocks with the inner wall of each of the contact supporting holes 213 to allow the common contact 40 to be supported by the housing 21. The first base 41 includes cut portions 411 separated from a carrier. When the common contact 40 is inserted into each of the contact supporting holes 213, the common contact 40 is separated from the carrier in a state in which both the right and left sides of the first base 41 are retained by a jig, and inserted into each of the contact supporting holes 213 by pressing both the right and left sides of the first base 41 with the jig.

The first contact portion 42 contacts the pad for a ground of the electronic component 70. As shown in FIGS. 3A-E, the first contact portion 42 includes: a pair of two-divided first protrusions 421 protruding from an edge 41*a*, closer to the first face 211 (see FIG. 1), of the first base 41 toward the first face 211 obliquely with respect to the first base 41; and a first linking portion 422 that links the pair of first protrusions 421 to each other in a protruding side. The first contact portion 42 has a spring property, and is elastically deformed by being pressed by the electronic component.

The second contact portion 43 contacts a ground on the circuit board 80. As shown in FIGS. 3A-E, the second contact portion 43 includes: a pair of two-divided second protrusions 431 protruding from an edge 41*b*, closer to the second face 212 (see FIG. 1), of the first base 41 toward the second face 212 obliquely with respect to the first base 41; and a second linking portion 432 that links the pair of second protrusions 431 to each other in a protruding side. Like the first contact portion 42, the second contact portion 43 has a spring property. The second contact portion 43 is elastically deformed by being pressed by the circuit board 80.

The pair of first protrusions 421 included in the first contact portion 42 of the common contact 40 has a shape in which a spacing, closer to the first linking portion 422, between the first protrusions 421 is greater than a spacing, closer to the first base 41, between the first protrusions 421. In other words, a maximum distance d2 closer to the first linking portion 422 is greater than a maximum distance d1 closer to the first base 41. In an embodiment, the maximum distance is continuously increased with being closer from d1 to d2. Like such a case, the pair of second protrusions 431 included in the second contact portion 43 has a shape in which the spacing d2, closer to the second linking portion 432, between the second protrusions 431 is greater than the spacing d2, closer to the first base 41, between the second protrusions 431. In other words, a maximum distance d4 closer to the first linking portion 422 is greater than a maximum distance d3 closer to the first base 41. In an embodiment, the maximum distance is continuously increased with being closer from d3 to d4. In such an embodiment, d1=d3 and d2=d4. However, d1 and d3 do not necessarily satisfy d1=d3, and d2 and d4 do not necessarily satisfy d2=d4 in other embodiments.

A distance between the contact and an adjacent contact is decreased to improve electric performance by making a shape in which the distance between the pair of first protrusions 421 is increased with being closer to the first linking portion 422, and a shape in which the distance between the pair of second protrusions 431 is increased with being closer to the second linking portion 432, as described above.

FIG. 4A-E show a power contact 50. The power contact 50 connects the pad for a power source of the electronic component 70 and the power source on the circuit board 80 to each other. The power contact 50 corresponds to an example of the second contact according to the invention. The power contact 50 includes a second base 51, a third contact portion 52, and a fourth contact portion 53.

Like the first base 41 of the common contact 40 illustrated in FIG. 3, the second base 51 is inserted into each of the contact supporting holes 213 and interlocking with the inner wall of each of the contact supporting holes 213 to allow the power contact 50 to be supported by the housing 21. The second base 51 includes cut portions 511 separated from a carrier. When the power contact 50 is inserted into each of the contact supporting holes 213, the power contact 50 is separated from the carrier in a state in which both the right and left sides of the second base 51 are retained by a jig, and inserted into each of the contact supporting holes 213 by pressing both the right and left sides of the second base 51 with the jig.

The third contact portion 52 contacts the pad for a power source of the electronic component 70. The third contact portion 52, as shown in FIGS. 4B and 4E, includes a pair of two-divided third protrusions 521 protruding from an edge 51*a*, closer to the first face 211 (see FIG. 1), of the second base 51 toward the first face 211 obliquely with respect to the second base 51. The pair of third protrusions 521 comes into contact with the pad for a power source of the electronic component 70 while remaining being divided into two portions. The third contact portion 52 has a spring property, and is elastically deformed by being pressed by the electronic component 70.

The fourth contact portion 53 contacts the power source on the circuit board 80. The fourth contact portion 53, as shown in FIGS. 4B and 4E, includes a pair of two-divided fourth protrusions 531 protruding from an edge 51*b*, closer to the second face 212 (see FIG. 1), of the second base 51 toward the second face 212 obliquely with respect to the second base 51. The pair of fourth protrusions 531 comes into contact with the power source on the circuit board 80 while remaining being divided into two portions. The fourth contact portion 53 also has a spring property, and is elastically deformed by being pressed by the circuit board 80.

The power contact 50 comes into contact with the electronic component and the circuit board while remaining being divided into two portions, whereby a parallel circuit is formed to reduce electrical resistance.

FIGS. 5A-E show a signal contact 60. FIG. 6 shows a signal contact pair 60. The signal contacts 60 are included in the contact pair including the pair of signal contacts 60, 60 which are bilaterally plane-symmetric with respect to a face S, as illustrated in FIG. 6. FIGS. 5A-E illustrate one signal contact 60 included in the contact pair. This signal contact 60 is a contact, of which the shape is different from the shapes of both of the common contact 40 and power contact 50 described above, is included in the contact pair as illustrated in FIG. 6, and carries out signal transmission between the electronic component 70 and the circuit board 80. The signal contact 60 corresponds to an example of the third contact according to the invention.

The signal contact 60 includes a third base 61, a fifth contact portion 62, and a sixth contact portion 63, as illustrated in FIGS. 5A-E. Like the first base 41 of the common contact 40 illustrated in FIG. 3 and the second base 51 of the power contact 50 illustrated in FIG. 4, the third base 61 is inserted into each of the contact supporting holes 213, interlocking with the inner wall of each of the contact supporting holes 213, and allowing the signal contact 60 to be supported by the housing 21. The third base 61 includes a cut portion 611 separated from a carrier. When the signal contact 60 is inserted into each of the contact supporting holes 213, the signal contact 60 is inserted into each of the contact supporting holes 213 by separating the third base 61 from a carrier in a state in which the third base 61 is retained with a jig, and pressing the third base 61 with the jig.

Figures 5A, 5B, 5C, 5D, 5E:
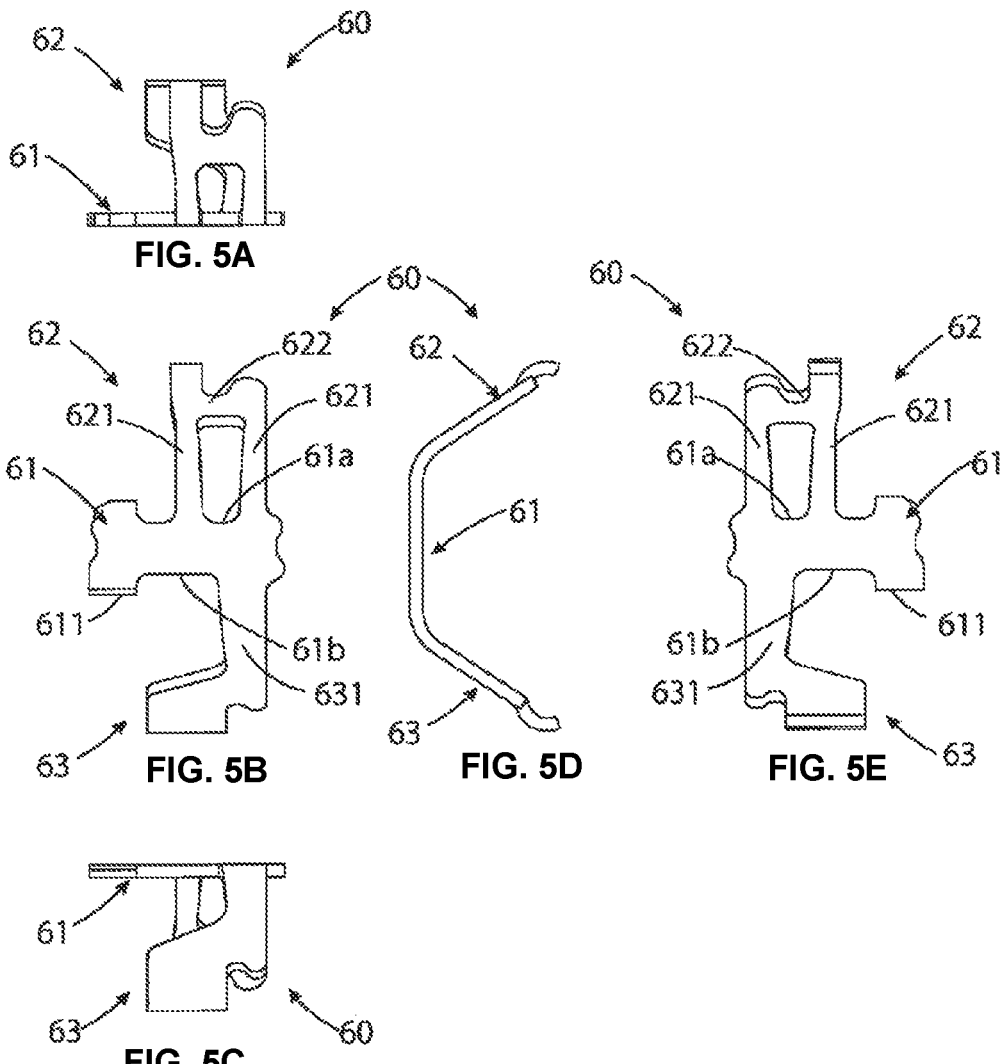
FIG. 5A is a top view of a signal contact.
FIG. 5B is a front view of the signal contact.
FIG. 5C is a bottom view of the signal contact.
FIG. 5D is a side view of the signal contact.
FIG. 5E is a rear view of the signal contact.
Figure 6:
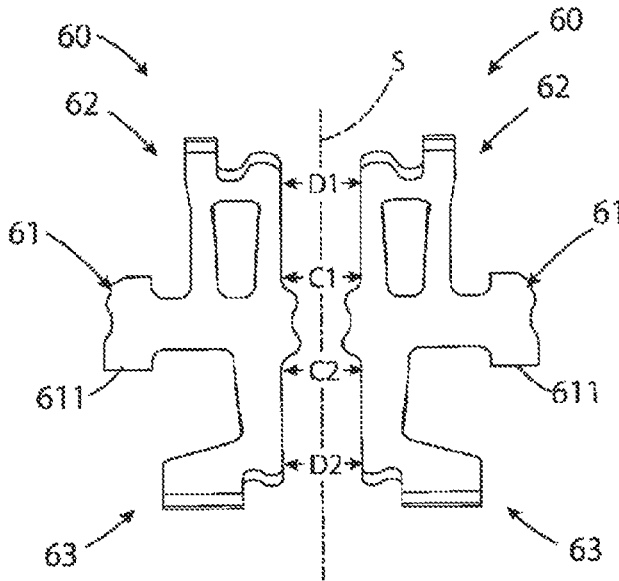
FIG. 6 is a front view of a signal contact pair.

As shown in FIGS. 5B and 5E, the fifth contact portion 62 includes: a pair of two-divided fifth protrusions 621 protruding from an edge 61*a*, closer to the first face 211 (see FIG. 1), of the third base 61 toward the first face 211 obliquely with respect to the third base 61; and a third linking portion 622 that links the pair of fifth protrusions 621 to each other in a protruding side. The fifth contact portion 62 comes into contact with the pad for signal transmission of the electronic component 70, and is thus elastically deformed.

As shown in FIGS. 5B and 5E, the sixth contact portion 63 includes a sixth protrusion 631 protruding from an edge 61*b*, closer to the second face 212 (see FIG. 1), of the second base 61 toward the second face 212 obliquely with respect to the third base 61, comes into contact with a signal transmission path on the circuit board 80, and is thus elastically deformed.

Whereas the fifth contact portion 62 includes the pair of fifth protrusions 621, only the one sixth protrusion 631 is included in the sixth contact portion 63. When the signal contact 60 is inserted into one of the contact supporting holes 213, the central portion of the third base 61 in the width direction of the edge 61*b* closer to the circuit board 80 is pressed with the jig. This is because it is impossible to press the central portion in the width direction of the edge 61*b* when the sixth contact portion 63 is allowed to have a shape similar to the shape of the fifth contact portion 62. However, the sixth contact portion 63 having the shape applies a minute twist to the sixth protrusion 631 when the sixth contact portion 63 comes into contact with the circuit board 80 and is thus elastically deformed. Thus, the twist is eliminated in an area closer to the electronic component 70 in which it is unnecessary to provide space for the jig, as a configuration having the pair of fifth protrusions 621.

When the signal contacts 60 are regarded as the contact pair illustrated in FIG. 6, the fifth contact portions 62 and the sixth contact portions 63 are formed at positions at which the fifth contact portions 62 of the two signal contacts 60 included in the contact pair are closer to each other in the width direction of the third bases 61. Moreover, the fifth contact portions 62 extend from the third bases 61 while keeping a first definite spacing. In other words, spacings C1 and D1 illustrated in FIG. 6 are equal to each other, and satisfy C1=D1. The sixth contact portions 63 also extend from the third bases 61 while keeping a second definite spacing. In other words, spacings C2 and D2 illustrated in FIG. 6 are equal to each other, and satisfy C2=D2. In the present embodiment, C1=C2 and D1=D2 are further satisfied. In the present embodiment, electrical characteristics are improved by allowing the two signal contacts 60 included in the contact pair to have such a shape.

Figures 7A, 7B, 7C, 7D, 7E, 7F, 7G:
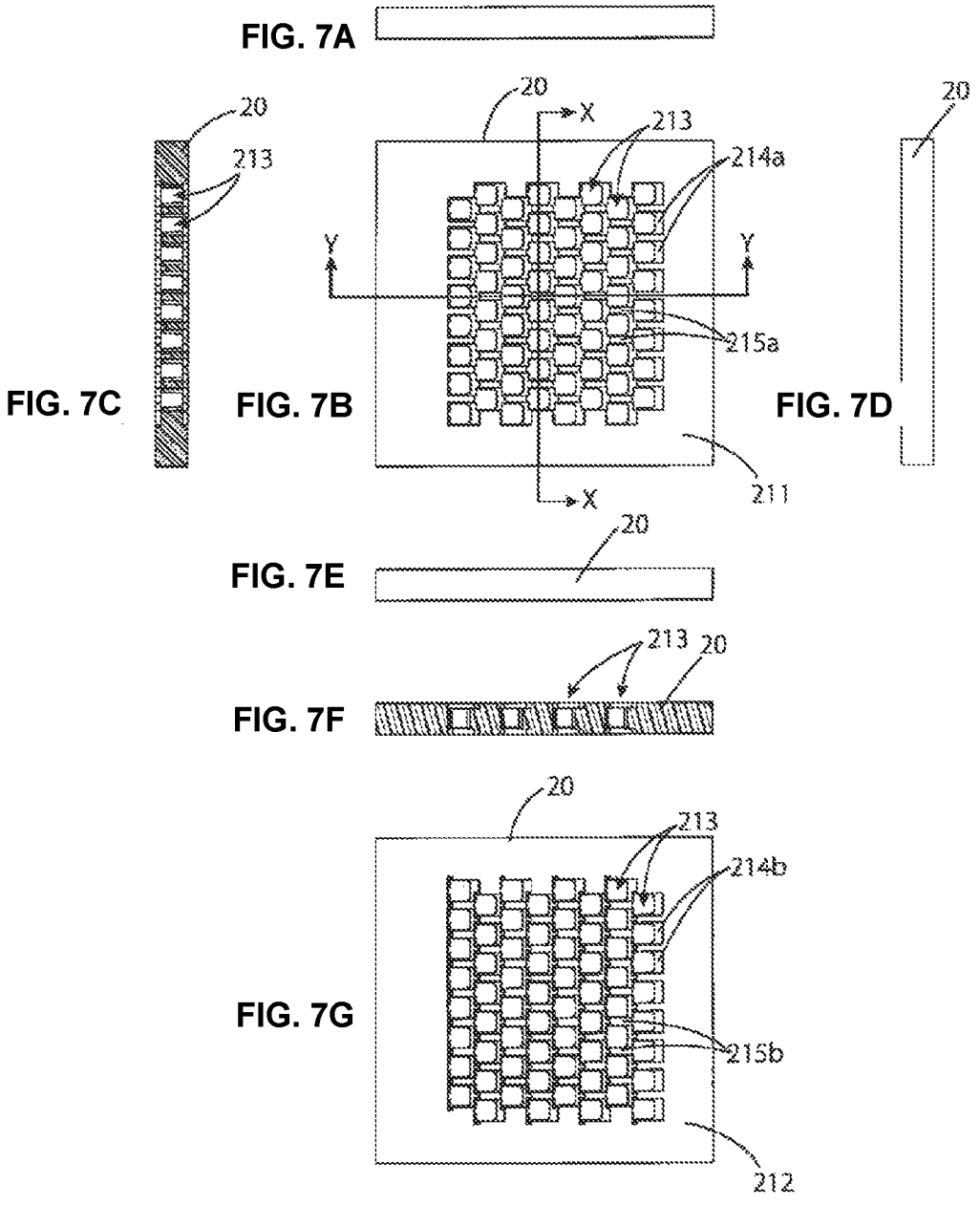
FIG. 7A is a top view of a housing.
FIG. 7B is a front view of the housing.
FIG. 7C is a sectional view of the housing, taken along arrow X-X of FIG. 7B.
FIG. 7D is a side view of the housing.
FIG. 7E is a bottom view of the housing.
FIG. 7F is a sectional view of the housing, taken along arrow Y-Y of FIG. 7B.
FIG. 7G is a rear view of the housing.
Figure 8:
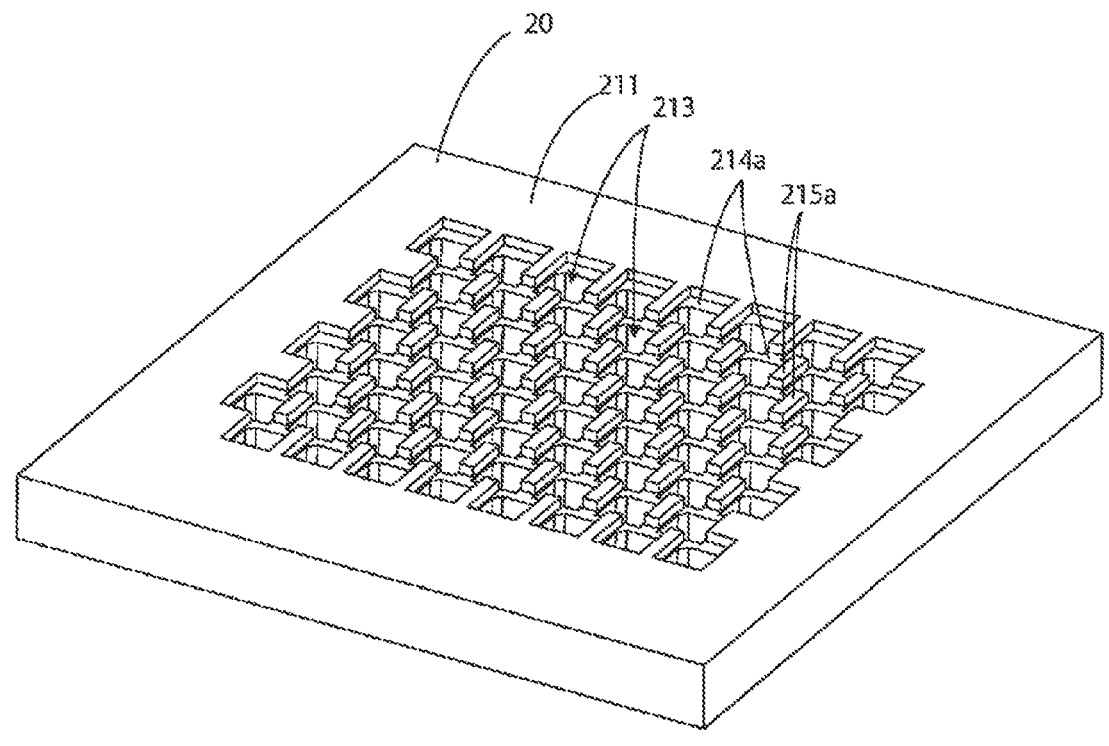
FIG. 8 is an isometric view of the housing.

FIGS. 7A-7G and FIG. 8 show the housing 20. FIG. 8 illustrates the greatly enlarged bottom plate 21 of the housing 20 illustrated in FIG. 1, a slight part of the bottom plate 21, and a small number of contact supporting holes 213. In such a case, the slight part of the bottom plate 21 is referred to as "housing 20" again.

In such a case, the 8×8 contact supporting holes 213 are arranged in the flat-plate-shaped housing 20. The contact supporting holes 213 have the same shape and the same dimension, and are formed with definite pitches. A table portion 215*a* or 215*b*, on which a housing portion 214*a* or 214*b* housing a portion of each contact, protruding from the housing 20, elastically deformed by pressing the portion of each contact, protruding from the housing 20, by the electronic component 70 or the circuit board 80, in correspondence with each contact supporting hole 213 is put, is disposed on the periphery of each contact supporting hole 213. The first face 211 of the housing 20 is illustrated in FIG. 8. As illustrated in FIGS. 7B and 7G, the second face 212 of the housing 20 also has a similar structure. The housing portion 214a and the table portion 215a closer to the first face 211 correspond to respective examples of the first housing portion and the first table portion according to the invention, and the housing portion 214b and the table portion 215b closer to the second face 212 correspond to respective examples of the second housing portion and the second table portion according to the invention. The housing portions 214a and 214b corresponding to the contact supporting holes 213, and the table portions 215a and 215b are disposed on both faces of the housing 20, whereby the electronic component 70 can be directly placed on the housing 20, and the housing 20 can be directly placed on the circuit board 80.

Figure 9:
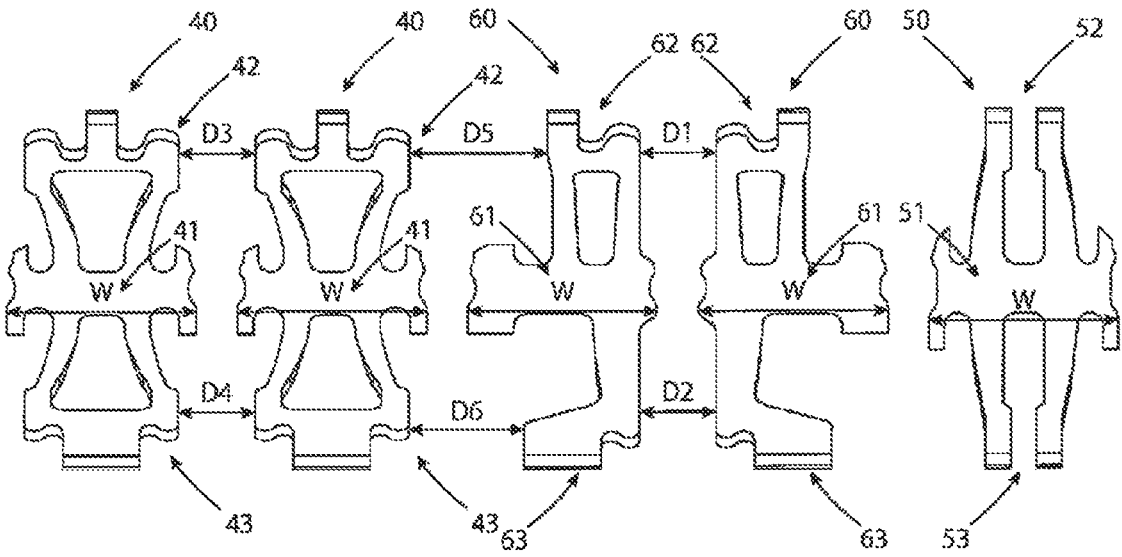
FIG. 9 is a front view of various contacts arranged with pitches with which the contacts are inserted into the housing.

FIG. 9 is a view illustrating various contacts arranged with pitches with which the contacts are inserted into the housing 20. When common contacts 40 are placed adjacently to each other, the spacing between the first contact portions 42 of the common contacts 40 adjacent to each other is a spacing D3, and the spacing between the second contact portions 43 is a spacing D4. In an embodiment, the spacing D3=spacing D4. Moreover, the spacing between the fifth contact portions 62 of the signal contacts 60 included in the contact pair is the spacing D1 as also illustrated in FIG. 6, the spacing between the sixth contact portions 63 is the spacing D2, and in an embodiment spacing D1=spacing D2. All of the spacings D1 to D4 are less than a spacing D5 between the first contact portion 42 of the common contact 40 and the fifth contact portion 62 of the signal contact 60 and a spacing D6 between the second contact portion 43 of the common contact 40 and the sixth contact portion 63 of the signal contact 60 when the common contact 40 and the signal contact 60 are adjacent to each other. As a result, electrical coupling between the common contacts 40 and electrical coupling between the signal contacts 60 are enhanced.

As shown in FIG. 9, each of the widths of the bases of the contacts adjacent to each other is always a definite width W regardless of the kinds of the contacts adjacent to each other. In other words, all the widths of the bases which are the first base 41, the second base 51, and the third base 61 are the same. Therefore, the formation of the contact supporting holes 213 having the same dimension in the housing 20 enables any contacts to be inserted into any contact supporting holes 213 regardless of the kinds of the contacts, and enables the inserted contact to be supported by each contact supporting hole 213 even when any kind of the contact is inserted into each contact supporting hole 213.

Figure 10:
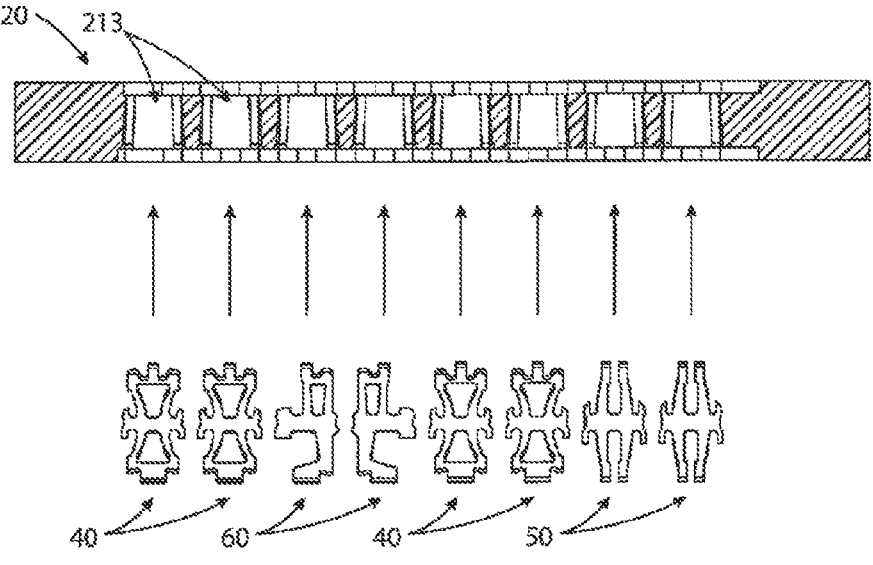
FIG. 10 is a sectional side view of the contacts of FIG. 9 and the housing.
Figures 11A, 11B, 11C, 11D, 11E, 11F:
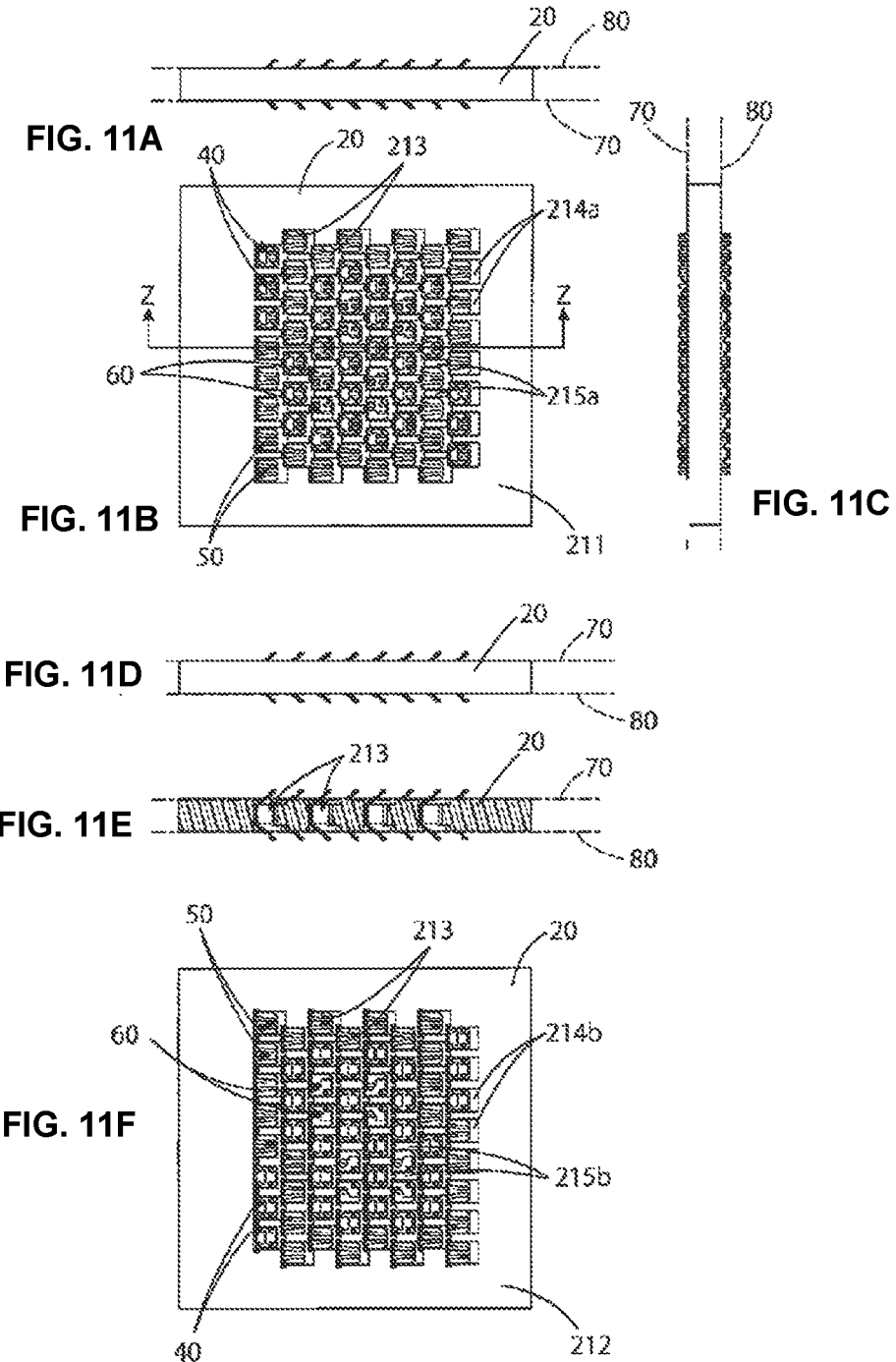
FIG. 11A is a top view of contacts in a state of being inserted into the housing.
FIG. 11B is a front view of contacts in the state of being inserted into the housing.
FIG. 11C is a side view of contacts in the state of being inserted into the housing.
FIG. 11D is a bottom view of contacts in the state of being inserted into the housing.
FIG. 11E is a sectional side view of contacts in the state of being inserted into the housing, taken along arrow Z-Z of FIG. 11B.
FIG. 11F is a rear view of the contacts in the state of being inserted into the housing.

FIG. 10 is a view illustrating various contacts and a cross section of the housing. The cross section of the housing 20, illustrated in FIG. 10 is the same cross section as the cross section illustrated in FIG. 7C. In FIG. 10, the various contacts are arranged with the same pitches as the pitches of the contact supporting holes 213.

In the example described in such a case, two common contacts 40, two signal contacts 60 forming a contact pair, two common contacts 40, and two power contacts 50 are inserted, in the order mentioned from the contact supporting hole 213 which is left in the view, into the eight contact supporting holes 213 forming a line.

As illustrated in FIG. 10, any kinds of the contacts can be inserted into any contact supporting holes 213. As a result, plural kinds of contacts can be placed at optional positions, and a socket ready for each of various electronic components can be assembled without newly redesigning the housing and the contacts.

Figure 12:
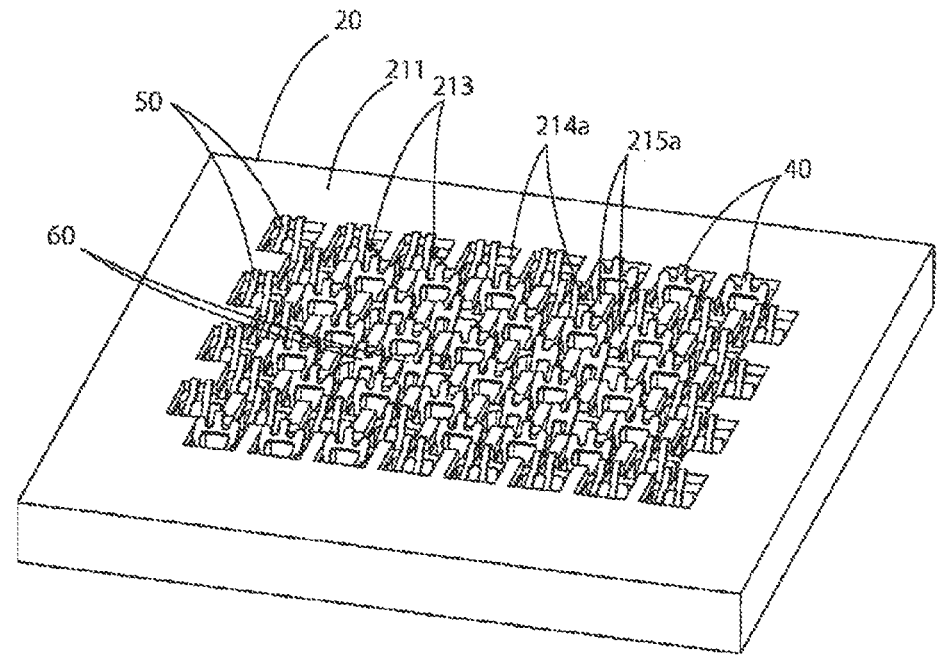
FIG. 12 is an isometric view of the housing and the contacts in the state of being inserted into the housing.

FIGS. 11A-F illustrate the housing 20 and contacts in the state of being inserted into the housing 20. FIG. 12 is an isometric view illustrating the housing 20 and the contacts in the state of being inserted into the housing 20. As illustrated in FIG. 12, common contacts 40, power contacts 50, and signal contacts 60 are inserted into the housing 20 in such a case.

Moreover, the bottom face of the electronic component 70 in the state of coming into contact with the housing 20 and the upper face of the circuit board 80 in the state of coming into contact with the housing 20 are illustrated in the FIGS. 11A-E. The contacts protrude from both the faces of the housing 20 regardless of the kinds of the contacts.

The protruding portions are pressed by the electronic component 70 or the circuit board 80, are thus elastically deformed, and are housed in the housing portions 214a and 214b (see FIGS. 7 and 8). Moreover, the electronic component 70 and the circuit board 80 are pressed against the table portions 215a and 215b.

As described above, the socket 10 of the present embodiment is allowed to be a socket having a structure with a high degree of freedom suitable for a larger number of pins by preparing the plural kinds of the contacts suitable for applications and allowing the contact supporting holes 213 to have the same shape.

The case in which the common contact 40 is used for a ground is described in the present embodiment. However, the common contact 40 is not limited to the common contact for a ground, but can be used for a power source or for signal transmission.

The socket 10 of the present embodiment includes all of the contact pairs including the common contact 40, the power contact 50, and the plane-symmetric signal contacts 60. However, the fundamental feature of the present invention is the shape of the common contact 40. Accordingly, the power contact 50 and the signal contacts 60 need not be included as long as the common contact 40 is included. Alternatively, it is acceptable that the common contact 40 is included, and either the power contact 50 or the signal contacts 60 are included. Further, a contact having a shape other than the shapes of the power contact 50 and the signal contacts 60 may be included.

The socket of the invention includes the first contact having the shape described above. Since the first contact has the shape, a distance between the first contact and an adjacent contact is decreased. As a result, electrical performance is improved, the socket can be used in a wide range of applications such as transmission of various signals, grounds, and power sources, and the socket for mounting various electronic components can be assembled. In accordance with the invention as described above, a socket having a structure suitable for a larger number of pins is provided.

The contact pair including the third contacts having such a structure enables the third base to be pressed and inserted while decreasing a distance between the two third contacts included in the contact pair to improve electrical performance. The third contacts exhibit an advantage when high-speed signal transmission is required, wherein it is difficult to carry out such high-speed signal transmission by the first contact.

What is claimed is:

1. A socket, comprising:

a housing including a bottom plate having a flat-plate shape with a first face and a second face that are parallel to each other, a plurality of contact supporting holes penetrate the first face and the second face, and a frame body disposed upright on an edge of the first face and extending along the edge; and a plurality of contacts disposed in the contact supporting holes and supported by the bottom plate in a state in which the contacts protrude from both the first face and the second face, the contacts include a first contact, a second contact, and a pair of third contacts, the pair of third contacts are plane-symmetric with respect to each other, the first contact having:

a first base inserted into one of the contact supporting holes;

a first contact portion having a pair of first protrusions protruding from one edge of the first base, corresponding to the first face, toward the first face, and a first linking portion linking the pair of first protrusions to each other in a protruding end, the first linking portion having a shape in which a maximum distance closer to the first linking portion, between the pair of first protrusions, is greater than a maximum distance closer to one edge of the first base, between the pair of first protrusions; and a second contact portion having a pair of second protrusions protruding from another edge of the first base, corresponding to the second face, toward the second face, and a second linking portion linking the pair of second protrusions to each other in a protruding end, the second linking portion having a shape in which a maximum distance closer to the second linking portion, between the pair of second protrusions, is greater than a maximum distance closer to another edge of the first base, between the pair of second protrusions; and the second contact having a second base inserted into one of the contact supporting holes and a third contact portion having a pair of third protrusions protruding from one edge of the second base, corresponding to the first face, toward the first face, and having a shape in which the third protrusions are divided into two portions up to an end.

2. The socket of claim 1, wherein the frame body allows an electronic component to be located in an in-plane direction of the first face when the electronic component, having a bottom surface on which a plurality of pads including a pad for a ground and a pad for a power source and carrying out electrical connection are formed, is mounted on the socket.

3. The socket of claim 1, wherein the maximum distance between the pair of first protrusions continuously increases from the first base to the first linking portion.

4. The socket of claim 3, wherein the maximum distance between the pair of second protrusions continuously increases from the first base to the second linking portion.

5. The socket of claim 1, wherein the second contact has a fourth contact portion having a pair of fourth protrusions protruding from another edge of the second base, corresponding to the second face, toward the second face, and having a shape in which the fourth protrusions are divided into two portions up to an end.

6. The socket of claim 1, wherein each of the third contacts has a third base inserted into one of the contact supporting holes and a fifth contact portion having a pair of fifth protrusions protruding from one edge of the third base, corresponding to the first face, toward the first face, and a third linking portion linking the pair of fifth protrusions to each other in a protruding end.

7. The socket of claim 6, wherein each of the third contacts has a sixth contact portion with a sixth protrusion portion protruding from another edge of the third base, corresponding to the second face, toward the second face.

8. The socket of claim 7, wherein the fifth contact portions of the pair of third contacts extend from the third base while keeping a first definite spacing between the fifth contact portions.

9. The socket of claim 8, wherein the sixth contact portions of the pair of third contacts extend from the third base while keeping a second definite spacing between the sixth contact portions.

10. The socket of claim 1, wherein each of the contact supporting holes supports any of the contacts.

11. The socket of claim 2, wherein the bottom plate has, at a side closer to the first face, a first housing portion that houses a section of the contacts.

12. The socket of claim 11, wherein the first housing portion protrudes toward the first face, a portion of each contact of the section of the contacts housed by the first housing portion is pressed and elastically deformed by the electronic component.

13. The socket of claim 12, wherein the bottom plate has a first table portion on which the electronic component is placed.

14. The socket of claim 13, wherein the bottom plate has a second housing portion that houses a section of the contacts.

15. The socket of claim 14, wherein the second housing portion protrudes toward the second face, a portion of each contact of the section of the contacts housed by the second housing portion is pressed and elastically deformed by a circuit board.

16. The socket of claim 15, wherein the bottom plate has a second table portion abutting the circuit board.

17. The socket of claim 1, wherein a shape of each third contact is different from a shape of the first contact.

18. A socket, comprising:

a housing including a bottom plate having a flat-plate shape with a first face and a second face that are parallel to each other, and a plurality of contact supporting holes penetrating the first face and the second face; and a plurality of contacts disposed in the contact supporting holes and supported by the bottom plate in a state in which the contacts protrude from both the first face and the second face, the contacts include a first contact and a second contact, the first contact has a first base inserted into one of the contact supporting holes, the second contact has a second base inserted into one of the contact supporting holes and a third contact portion having a pair of third protrusions, the third protrusions are divided into two portions up to an end, the pair of third protrusions protrude from one edge of the second base, corresponding to the first face, toward the first face.

19. A socket, comprising:

a housing including a bottom plate having a flat-plate shape with a first face and a second face that are parallel to each other, a plurality of contact supporting holes penetrate the first face and the second face, and a frame body disposed upright on an edge of the first face and extending along the edge; and a plurality of contacts disposed in the contact supporting holes and supported by the bottom plate in a state in which the contacts protrude from both the first face and the second face, the contacts include a first contact and a pair of third contacts, the first contact having:

a first base inserted into one of the contact supporting holes;

a first contact portion having a pair of first protrusions protruding from one edge of the first base, corresponding to the first face, toward the first face, and a first linking portion linking the pair of first protrusions to each other in a protruding end, the first linking portion having a shape in which a maximum distance closer to the first linking portion, between the pair of first protrusions, is greater than a maximum distance closer to one edge of the first base, between the pair of first protrusions; and a second contact portion having a pair of second protrusions protruding from another edge of the first base, corresponding to the second face, toward the second face, and a second linking portion linking the pair of second protrusions to each other in a protruding end, the second linking portion having a shape in which a maximum distance closer to the second linking portion, between the pair of second protrusions, is greater than a maximum distance closer to another edge of the first base, between the pair of second protrusions; and each of the third contacts having a third base inserted into one of the contact supporting holes and a fifth contact portion having a pair of fifth protrusions protruding from one edge of the third base, corresponding to the first face, toward the first face, and a third linking portion linking the pair of fifth protrusions to each other in a protruding end.

\*  \*  \*  \*  \*